United States Patent [19]
Shan et al.

[11] Patent Number: 6,022,446
[45] Date of Patent: Feb. 8, 2000

[54] SHALLOW MAGNETIC FIELDS FOR GENERATING CIRCULATING ELECTRONS TO ENHANCE PLASMA PROCESSING

[76] Inventors: Hongching Shan, 3630 Tumble Way, San Jose, Calif. 95132; Bryan Pu, 750 N. King Rd. #509, San Jose, Calif. 95133; Ji Ding, 535 Hacienda Ave. #103, Campbell, Calif. 95008; Michael Welch, 940 Roma St., Livermore, Calif. 94550

[21] Appl. No.: 08/517,178

[22] Filed: Aug. 21, 1995

[51] Int. Cl.$^7$ ................................................. H01L 21/00
[52] U.S. Cl. ................................................. 156/345; 438/732
[58] Field of Search ................... 156/345 ME, 345 MG; 216/70; 438/728, 732; 204/298.37

[56] References Cited

U.S. PATENT DOCUMENTS

| | | | |
|---|---|---|---|
| 4,842,707 | 6/1989 | Kinoshita | 156/345 X |
| 4,943,361 | 7/1990 | Kakehi et al. | 156/345 X |
| 4,950,377 | 8/1990 | Huebner | 156/345 X |
| 5,272,417 | 12/1993 | Ohmi | 156/345 X |
| 5,505,780 | 4/1996 | Dalvie et al. | 156/345 X |
| 5,824,607 | 10/1998 | Trow et al. | 438/732 |

*Primary Examiner*—William Powell
*Attorney, Agent, or Firm*—Michaelson & Wallace

[57] ABSTRACT

The present invention is embodied in a plasma reactor for processing a workpiece such as a semiconductor wafer having an axis of symmetry, the reactor including a reactor chamber with a ceiling, a pedestal for supporting the workpiece within the chamber under the ceiling, a processing gas supply inlet into the chamber, an RF plasma power source coupled to the pedestal, and a magnetic field source near the ceiling providing a radially symmetrical magnetic field relative to the axis of symmetry within a portion of the chamber near the ceiling. The magnetic field source can include an electromagnet or plural magnets disposed over the ceiling in a radially symmetrical fashion with respect to the axis of symmetry. The plural magnets may be permanent magnets or electromagnets. The radially symmetrical magnetic field penetrates from the ceiling into the chamber to a shallow depth, and the height of the ceiling above the workpiece exceeds the depth.

34 Claims, 4 Drawing Sheets

SHALLOW MAGNETIC FIELDS FOR GENERATING CIRCULATING ELECTRONS TO ENHANCE PLASMA PROCESSING

BACKGROUND OF THE INVENTION

1. Technical Field

The invention concerns a magnetically enhanced reactive ion etch (MERIE) plasma reactor and specifically an MERIE plasma reactor having a shallow magnetic field with minimal strength at the wafer surface and with radial symmetry across the wafer surface.

2. Background Art

A plasma reactor for processing a substrate such as a semiconductor wafer typically includes a reactor chamber containing a processing gas and a pedestal supporting the wafer within the chamber. In order to ignite a plasma by ionizing the processing gas, a radio frequency (RF) power source is applied to the wafer pedestal. The RF power coupled into the chamber ignites and maintains a plasma while also attracting ions toward the wafer pedestal. The RF power excites the electrons in the chamber by reason of their high charge-to-mass ratio, and the excited electrons collide with neutral species (e.g., molecules and radicals) of the processing gas to create ions. The ions react with the wafer on the pedestal to etch certain thin films thereon, for example, while some ion-wafer collisions cause ion bombardment or sputtering damage on the wafer surface, depending upon the energy with which the ions collide with the wafer surface. The ion energy is determined by the RF power applied to the wafer pedestal.

A fundamental limitation of such a plasma reactor is that there is a tradeoff between the plasma density and the ion bombardment damage on the wafer. This is because in order to increase the plasma ion density in the chamber, the RF power applied to the wafer pedestal must be increased, which in turn increases the ion energy at the wafer surface, thereby increasing ion bombardment damage. This tradeoff limits the performance of a plasma reactor. In a plasma reactor which performs a plasma etch process, the processing gas is an etchant such as HF, $CHF_3$, $CF_3$ or $CF_6$, for example, and the etch rate is determined in large part by the density of fluorine-containing ions, which in turn is limited by constraining the RF power applied to the wafer pedestal to avoid excessive ion bombardment damage to the wafer.

Another problem is that increasing the RF power (in order to increase plasma ion density) increases sputtering of the chamber ceiling and walls. Such increased sputtering of the chamber ceiling and walls increases the amount of sputtered material introduced into the chamber and onto the wafer which can interfere with the etch process. For example, if the ceiling is quartz and the process being performed on the wafer is a silicon dioxide etch process, then some fraction of the quartz sputtered from the ceiling deposits onto the wafer surface and competes with the etch process, thereby reducing the etch rate. Also, unless the ceiling is of a material compatible with the particular etch being carried out on the wafer (e.g., a silicon dioxide or quartz ceiling for a silicon dioxide etch process, or an aluminum ceiling for an aluminum etch process), then the ceiling material sputtered into the chamber contaminates the wafer. (Sputtering of the ceiling also consumes an expensive component of the chamber). As another example, if the processing gas includes $CF_3$ or $CF_6$, the polymer material formed therefrom on the interior ceiling surface may be sputtered onto the wafer surface, thereby contaminating microelectronic devices on the wafer surface.

One technique for enhancing the plasma ion density in a plasma etch process without necessarily increasing ion bombardment damage on the wafer and sputtering is magnetically enhanced reactive ion etching (MERIE). In this technique, the plasma reactor described above is improved by the addition of plural (typically four) ring magnets placed symmetrically around the sides of the chamber. Typically, the diameter of each magnet is on the order of the height of the reactor chamber. The MERIE magnetic field produced within the chamber by these magnets causes the electrons—due to their large charge-to-mass ratio—to assume a complex circular and spiral motion in addition to their vertical linear motion induced by the RF power applied to the wafer pedestal. The circular and spiral motion of the electrons induced by the MERIE magnetic field increases the ionizing collisions by the electrons, thereby increasing the plasma ion density. The result is that ion density—and therefore the etch rate—is increased. However, there is no proportionate increase in ion bombardment damage on the wafer because the RF power applied to the wafer pedestal is not increased. Moreover, any spiral motion of the ions induced by the MERIE magnetic field does not directly increase the ion-wafer collision energy.

The ion-wafer collision energy is not proportionately increased by the MERIE magnetic field because any spiral motion of the ions induced by the MERIE magnetic field is generally in a horizontal plane (parallel to the wafer surface).

One problem with such MERIE techniques is that the magnetic field within the chamber is necessarily discontinuous because it is produced by (four) discrete adjacent magnets. The plasma ions tend to be focused into "corner" areas between the magnets, thus producing non-uniform etch rates across the wafer surface, a significant disadvantage. Further, it has been generally found that the plasma ions tend to migrate toward the wafer edge and away from the wafer center, thus contributing to the non-uniformity in etch rate across the wafer surface. Often, the etch rate tends to vary greatly along a given radius of the wafer, the etch rate on the wafer increasing with the radius.

This problem of non-uniform etch rate has been ameliorated in MERIE plasma reactors by rotating the magnetic field produced by the plural (four) magnets placed around the side of the chamber. Typically, such rotation is achieved by employing electromagnets around the sides of the chamber and applying RF signals in the magnet windings, a sine wave RF signal being applied to the windings of alternate ones of the magnets and a cosine wave RF signal of the same frequency being applied to the windings of the remaining ones of the magnets, for example. The idea is that the rotation of the magnetic field within the chamber across the wafer surface disperses corner effects and reduces ion focusing and thereby reduces plasma ion non-uniformity across the wafer surface, thus providing a partial solution to the problem.

However, this solution raises two additional problems. First, the rotation of the MERIE magnetic field must be limited to below ten Hertz to avoid excessive heating of the chamber side walls, thus limiting its efficacy. Second, the rotation of the MERIE magnetic field across the wafer surface produces charge damage in the microelectronic semiconductor structures already fabricated on the wafer surface. For example, thin gate oxide layers are particularly susceptible to breakdown. Such breakdown occurs because the changing magnetic field across the wafer surface produces relatively large forces on charges already accumulated in such microelectronic structures during plasma processing in the reactor.

Even without rotation of the magnetic field there is a risk of charge damage to microelectronic structures simply because the magnetic field itself is non-uniform across the wafer surface, leading to non-uniform plasma ion and electron density across the wafer surface. Such non-uniform plasma ion and electron distribution across the wafer surface leads to non-uniform charge accumulation and electrical potential differences across the wafer surface. Such potential differences can be sufficient to break down the more susceptible features (e.g., thin gate oxide layers) of the microelectronic structures on the wafer. Accordingly, the inventors herein recognize that the presence of the MERIE magnetic field at the wafer surface is itself a problem which limits the performance of MERIE reactors.

Therefore, it is an object of the present invention to provide an MERIE magnetic field which is of a minimum strength at the wafer surface and of maximum strength elsewhere in the reactor chamber.

It is another object of the present invention to provide an MERIE magnetic field which has improved uniformity across the wafer surface.

It is a related object of the present invention to provide an MERIE magnetic field which has radial symmetry across the wafer surface.

SUMMARY OF THE DISCLOSURE

The present invention is embodied in a plasma reactor for processing a workpiece such as a semiconductor wafer having an axis of symmetry, the reactor including a reactor chamber with a ceiling, a pedestal for supporting the workpiece within the chamber under the ceiling, a processing gas supply inlet into the chamber, an RF plasma power source coupled to the pedestal, and a magnetic field source near the ceiling providing a radially symmetrical magnetic field relative to the axis of symmetry within a portion of the chamber near the ceiling. The magnetic field source can include an electromagnet or plural magnets disposed over the ceiling in a radially symmetrical fashion with respect to the axis of symmetry. The plural magnets may be permanent magnets or electromagnets. The radially symmetrical magnetic field penetrates from the ceiling into the chamber to a shallow depth, and the height of the ceiling above the workpiece exceeds the depth.

The plural magnets may be plural ring magnets over the ceiling and centered at the axis of symmetry. The ring magnets may be supplemented by a bar magnet disposed over the ceiling and on the axis of symmetry and having a magnetic field which contributes constructively to the field produced by the plural ring magnets. Alternatively, the plural magnets may be plural spoke magnets aligned with respective radii centered at the axis of symmetry.

If the magnetic source is an electromagnet, then it may include plural windings formed of a single conductor path and disposed in radially symmetrical fashion with respect to the axis of symmetry, the conductor path having two ends for receiving an electrical current. The plural windings may be confined within a torus having a center hole.

DETAILED DESCRIPTION OF THE PREFERRED EMBODIMENTS

Figure 1A:
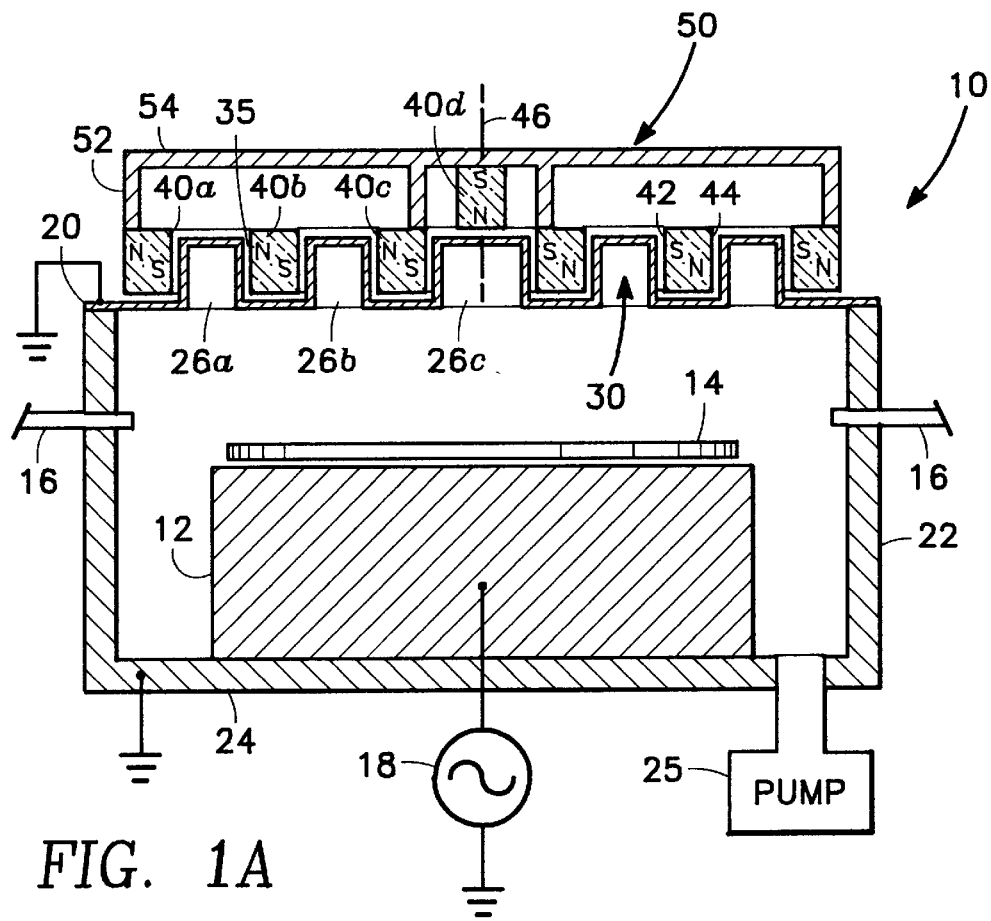
FIG. 1A is a cut-away side view of a plasma reactor of a first embodiment of the invention employing permanent ring magnets near the reactor ceiling.
Figure 1B:
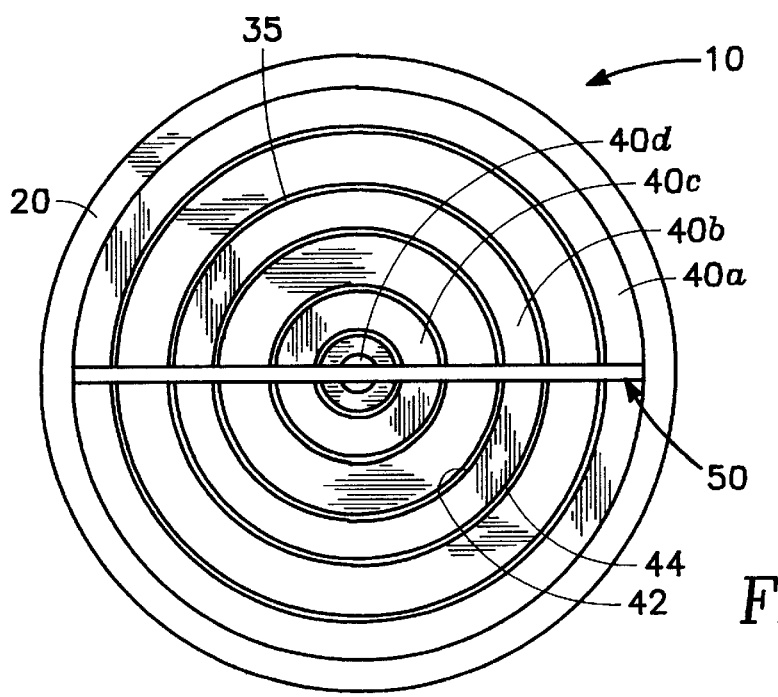
FIG. 1B is a top view corresponding to FIG. 1A.

Referring to FIGS. 1A and 1B, an MERIE plasma reactor includes a chamber 10 having a pedestal 12 for supporting a workpiece 14 such as a semiconductor wafer within the chamber. Gas inlets 16 supply a processing gas (such as an etchant gas) into the interior of the chamber 10. An RF power source 18 connected between the pedestal 12 and ground provides sufficient power to ionize the processing gas within the chamber to provide and maintain a plasma therein. The power source 18 includes conventional impedance matching circuitry for maintaining an impedance match between output impedance of the power source 18 and the load impedance presented by the plasma in the chamber. The chamber 10 is enclosed by a round ceiling 20 made of aluminum, silicon or quartz, a cylindrical aluminum side wall 22 and a floor 24. Typically, the ceiling 20 and side wall 22 of the chamber 10 are grounded. A vacuum pump 25 controls the pressure inside the chamber 10.

In accordance with the invention, the ceiling 20 has annular concentric ceiling corrugations 26a, 26b, 26c therein. Each ceiling corrugation 26 defines an internal annular channel 30 inside the chamber 10 flanked by a pair of external annular channels 35 outside of the chamber 10. The processing gas and plasma fills the interior of the chamber 10 including the interior annular channels 30. For this purpose, the processing gas inlets 16 may be located either along the cylindrical side wall 22 (as shown in the drawing) or at the top of each interior annular channel 30.

Ring magnets 40a, 40b, 40c outside of the chamber 10 rest within respective external annular channels 35. Each magnet 40 is magnetized such that its inner circumference 42 constitutes one pole of the magnet (e.g., the south pole) while its outer circumference 44 constitutes the opposite pole of the magnet (e.g., the north pole). As indicated in FIG. 1A, each interior annular channel 30 lies between opposite magnetic poles so that magnetic field lines extend approximately radially through each interior annular channel 30 relative to the axis of symmetry 46 of the cylindrical chamber 10.

A center magnet 40d overlies the center corrugation 26c in the center of the ceiling 20. The north pole of the center magnet 40d is adjacent the top of the center corrugation 26c while the south pole of the center bar magnet 40d faces away from the ceiling 20.

In accordance with an optional feature of the invention, a yoke 50 of a magnetic material (such as iron) may be connected to one pole (e.g., the south pole) of the innermost magnets (e.g., the south poles of the center magnet 40*d* and the innermost ring magnet 40*c*) and to the opposite pole (e.g., the north pole) of the outermost ring magnet 40*a*. An advantage of the yoke 50 is that it better confines the MERIE field produced by the magnets 40 away from the wafer pedestal 12. The yoke 50 includes vertical members 52 connected to, respectively, the south poles of the center magnet 40*d* and the innermost ring magnet 40*c* and to the north pole of the outermost ring magnet 40*a* and a horizontal member 54 connected to all of the vertical members 52.

As electrons of the plasma inside the interior annular channels 30 are accelerated in a generally vertical direction (between the pedestal 12 and ceiling 20) by the RF power applied to the wafer pedestal 12, the MERIE magnetic field extending horizontally across each interior annular channel 30 causes the electrons to execute a spiral motion about a generally vertical axis. This additional (spiral) motion of the electrons produces a greater number of ionizing collisions with neutral particles (molecules, radicals) of the processing gas, thereby enhancing plasma ion production within the interior annular channels 30 inside the chamber 10. This enhances the plasma ion density throughout the chamber 10 without any increase in the power of the RF source 18 and therefore without a proportional increase in ion bombardment damage on the wafer.

If the processing gas inside the chamber 10 includes an etchant such as fluorine, this ionization process produces fluorine ions and radicals which react with and etch certain materials on the wafer surface (such as silicon bulk, polysilicon layers or silicon dioxide layers, for example). In such an etch process, the greater plasma ion density provides a greater etch rate without proportionately greater ion bombardment damage on the wafer.

One advantage the MERIE reactor of FIGS. 1A and 1B provides over conventional MERIE reactors is that the magnetic field has far greater uniformity and is in fact radially symmetrical. This is due to the ring-like shape of the magnets 40. As a result, there are virtually no corners in the magnetic field to focus electrons or ions near the wafer surface, so that plasma ion density is more uniform. This greater uniformity of the plasma ion density provides far greater uniformity in etch rate across the wafer surface, a significant advantage. Another advantage of such increased uniformity is that it reduces electric charge accumulation and charge damage or breakdown damage (in microelectronic structures on the wafer) of the type caused in conventional MERIE plasma reactors by corners in the magnetic field or focusing of ions or electrons.

Another advantage of the MERIE reactor of FIGS. 1A and 1B is that the MERIE magnetic field produced by the plural ring magnets 40 is generally restricted to the interior annular channels 30 and falls off so rapidly away from the ceiling 20 (approximately as the square of the distance) that there is little or no magnetic field at the wafer. Therefore, whatever non-uniformities that may exist in the magnetic field have little or no direct effect at the wafer surface. This reduces any magnetic field corner effects and charge focusing at the wafer surface, which in turn reduces charge accumulation and charge damage in microelectronic structures at the wafer surface.

For a given plasma ion density, the RF power applied to the wafer pedestal 12 may be decreased with the introduction of the magnets 40, since the MERIE magnetic field produced by these magnets enhances the plasma ion density. As a result, there is less sputtering of the chamber ceiling and walls. One advantage is that the reduction in sputtering of the chamber ceiling and walls reduces the amount of sputtered material introduced into the chamber 10 and onto the wafer which can interfere with the etch process. For example, if the ceiling is quartz and the process being performed on the wafer is a silicon dioxide etch process, then some fraction of the quartz sputtered from the ceiling deposits onto the wafer surface and competes with the etch process, thereby reducing the etch rate. Also, unless the ceiling is of a material compatible with the particular etch being carried out on the wafer (e.g., a silicon dioxide or quartz ceiling for a silicon dioxide etch process, or an aluminum ceiling for an aluminum etch process), then the ceiling material sputtered into the chamber contaminates the wafer. (Sputtering of the ceiling also consumes an expensive component of the chamber 10). As another example, if the processing gas includes $CF_3$ or $CF_6$, the polymer material formed therefrom on the interior ceiling surface may be sputtered onto the wafer surface, thereby contaminating microelectronic devices on the wafer surface. These problems are solved in the present invention with the reduction in ion energy for a given plasma ion density.

A further advantage of the embodiment of FIGS. 1A and 1B is that the chamber operating pressure has a much wider range (1–350 Mtorr) than inductively coupled plasma reactors (whose pressure range is generally restricted to 5–20 Mtorr).

In accordance with one implementation of the embodiment of FIGS. 1A and 1B for processing an 8-inch (20 cm) diameter semiconductor wafer, the wafer pedestal has a diameter of about 8 inches (20 cm), the chamber has a diameter of about 12 inches (30 cm) and the outside diameters of the three ring magnets 40*a*, 40*b*, 40*c* are (from the outermost one) as follows: 8 inches (20 cm), 6 inches (15 cm) and 4 inches (10 cm), while the outer diameter of the center magnet 40*d* is about 2 inches (5 cm). The height of each interior annular channel 30 is on the order of about 1 inch (2.5 cm) and the width of each interior annular channel 30 is also on the order of about 1 inch (2.5 cm). The width of each exterior annular channel 35 is on the order of about 1 inch (2.5 cm). Each ring magnet 40 has an annular width of about 1 inch or less so that it fits within the respective exterior annular channel 35. The field strength of each magnet 40 is on the order of about 500 Gauss. In this implementation, the RF power applied to the wafer pedestal 12 is about 1000 Watts at 13.56 Mhz and the processing gas (HF) flow rate is about 20–100 SCCM at a chamber pressure of about 20–200 Mtorr.

In accordance with an optional feature of this embodiment, the field strengths of the respective magnets 40 may differ in accordance with a progression from one to the next which compensates for an inherent etch rate non-uniformity along the wafer surface. For example, if the non-uniformity is such that the etch rate increases with radius from the center of the wafer surface, then the non-uniformity may be compensated by establishing a progression of magnetic field strengths of the magnets 40 in which the center magnet 40*d* has the maximum field strength (e.g., about 500 Gauss), the innermost ring magnet 40*c* has a medium field strength (e.g., about 450 Gauss), the intermediate ring magnet 40*b* has a lesser field strength (e.g., about 400 Gauss), and the outermost ring magnet 40*a* has the least field strength (e.g., about 350 Gauss). Depending upon the etch rate non-uniformity to be compensated, this progression may be reversed so that the magnets 40 increase in strength away from the center of the ceiling 20.

Figure 2A:
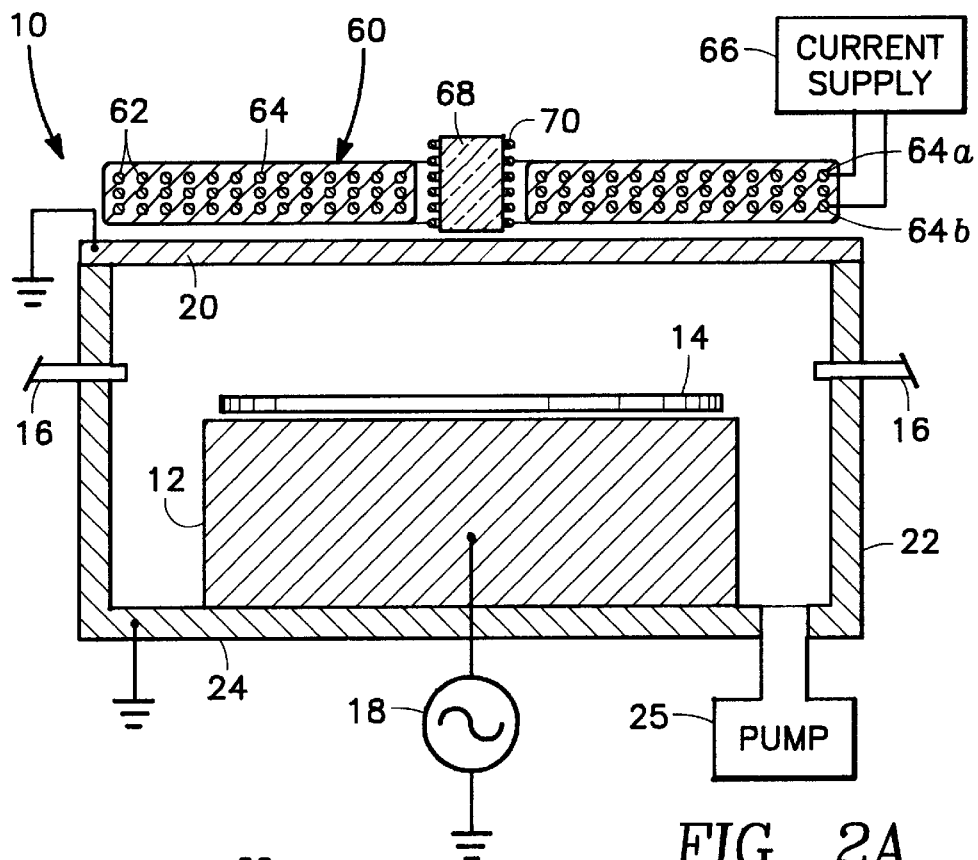
FIG. 2A is a cut-away side view of a plasma reactor of a second embodiment of the invention employing a torroidal electromagnet near the reactor ceiling.
Figure 2B:
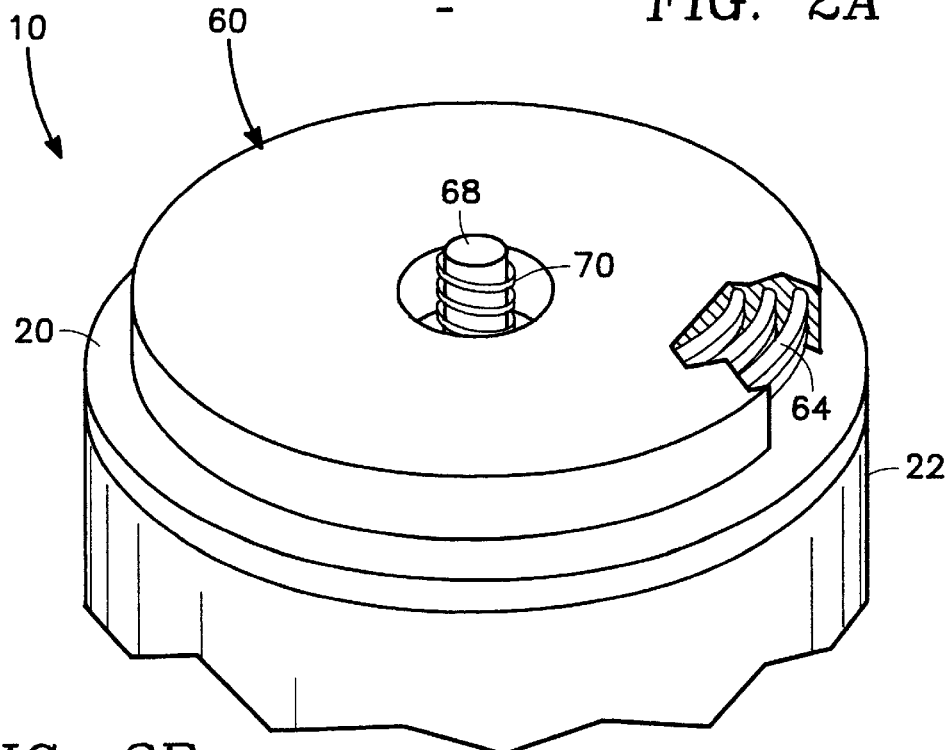
FIG. 2B is a perspective top view corresponding to FIG. 2A.

FIGS. 2A and 2B illustrate another embodiment which enjoys the advantages of the embodiment of FIGS. 1A and 1B, but with an additional advantage that the strength of the MERIE magnetic field may be varied or turned off as desired. In the embodiment of FIGS. 2A and 2B, an MERIE magnetic having radial symmetry is provided by a torus-shaped electromagnet 60 constituting an annular winding 62 of about 40 turns of a single continuous conductor 64 lying on top of the ceiling 20 in a plane parallel to that of the ceiling. In the embodiment of FIGS. 2A and 2B, the ceiling 20 can be planar. As described previously herein, radial symmetry of the MERIE magnetic field reduces or eliminates magnetic field corners and ion/electron focusing at the wafer surface. The MERIE magnetic field of the embodiment of FIGS. 2A and 2B is relatively shallow (as in the embodiment of FIGS. 1A and 1B) so that the wafer is beyond the effective range of the MERIE magnetic field, thereby preventing any ion focusing at the wafer surface and any charge damage to devices on the wafer surface.

A current source 66 is connected across the two ends 64a, 64b of the conductor 64 constituting the annular windings 62. The current source 66 may be a D.C. current source, an A.C. current source or RF current source (e.g., of RF frequency 13.56 Mhz). The electrical current applied by the current source 66 is preferably adjusted to provide a magnetic field strength of about 500 Gauss immediately below the ceiling 20.

In FIGS. 2A and 2B, the torus-shaped electromagnet 60 surrounds a center hole aligned with the rotational axis of symmetry of the torus. In accordance with an optional feature of the embodiment of FIGS. 2A and 2B, a small magnet 68 may be placed in the center of the hole. Preferably, the small magnet 68 is an electromagnet including a conductive coil winding 70 wound about the axis of symmetry of the torus-shaped electromagnet 60. The direction of current flow in the respective windings 62, 70 is such that the magnetic fields produced the respective windings 62, 70 enhance one another. For example, if current flow in the winding 62 is clockwise (looking down in the drawing if FIG. 2A) then current flow in the winding 70 is also clockwise. In this case (using the so-called "right-hand" rule), the MERIE magnetic field lines in FIG. 2A flow under the ceiling 20 from the outer circumference or perimeter toward the center and then upwardly through the center hole of the torus-shaped electromagnet 60.

In accordance with an optional feature of the embodiment of FIGS. 2A and 2B, the field strength of the electromagnet 60 varies as a function of radius to compensate for any inherent etch rate non-uniformity along the wafer surface. For example, if the non-uniformity is such that the etch rate decreases with radius from the center of the wafer surface, then the non-uniformity may be compensated by establishing a non-uniform distribution of magnetic field strengths which increases with radius along the torus-shaped electromagnet 60. Specifically, this is accomplished by increasing the number of windings 62 per unit of radial length as a function of radius, so that a larger number of windings is provided along the circumferential perimeter of the torus-shaped electromagnet 60. The number of windings per unit radial length of the electromagnet 60 may be varied in any fashion to compensate for any inherent non-uniformity in etch rate.

Figure 3A:
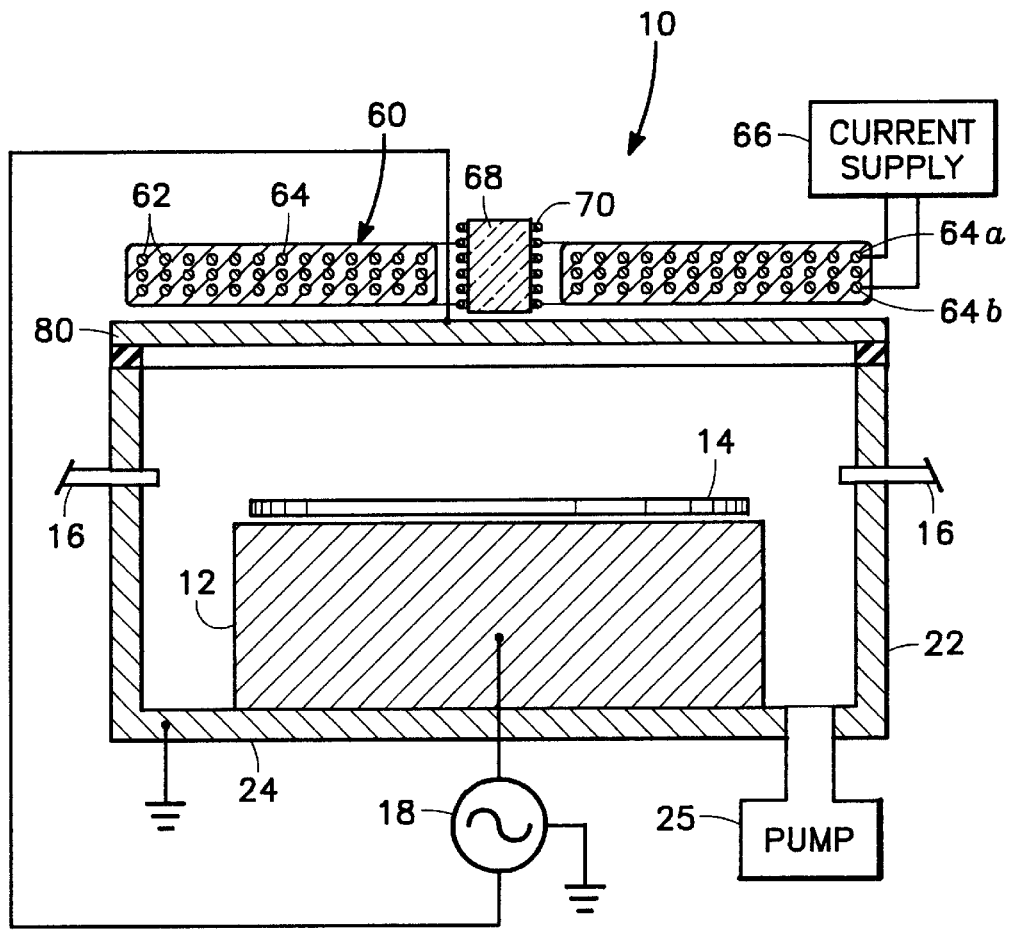
FIG. 3A is a cut-away side view of an embodiment corresponding to FIG. 2A having, in addition, an electrode near the reactor ceiling.
Figure 3B:
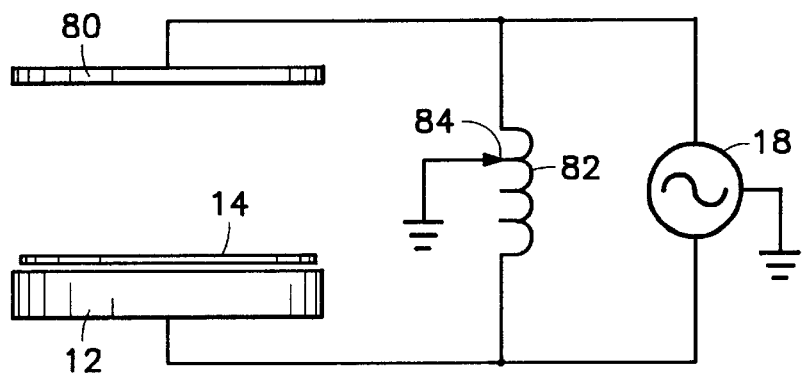
FIG. 3B is schematic diagram of one implementation of the embodiment of FIG. 3A.

In the embodiment of FIG. 3A, the ceiling 20 is replaced by a ceiling electrode 80 under the electromagnet 60. The ceiling electrode 80 is formed of a thin layer of non-magnetic conductive material (such as aluminum). One way of implementing the embodiment of FIGS. 3A and 3B is to connect the RF source 18 across the pedestal 12 and the ceiling electrode 80. Preferably, the ceiling electrode 80 is electrically insulated from any grounded surfaces of the chamber 10 such as the cylindrical side wall 22.

FIG. 3B illustrates another way of implementing the embodiment of FIG. 3A. In this implementation, the RF source 18 is connected across a coil inductor 82 and across the pedestal 12 and the ceiling electrode 80. The coil inductor 82 has a movable ground tap 84 whose position along the inductor 82 determines the apportionment of RF power between the pedestal 12 and the ceiling electrode 80. Preferably, the greater portion RF power is applied to the wafer pedestal 12 while a lesser portion is applied to the ceiling electrode 80. For this purpose, the ground tap 84 is positioned to contact a winding on the coil inductor 82 closer to the connection to the ceiling electrode 80 and further from the connection to the wafer pedestal 12. A pair of capacitors 86a, 86b are connected in series with respective ends of the coil inductor 82, while a variable capacitor 88 connected across the coil inductor 82 can provide impedance matching, as disclosed in the above-cited patent application.

Figure 4A:
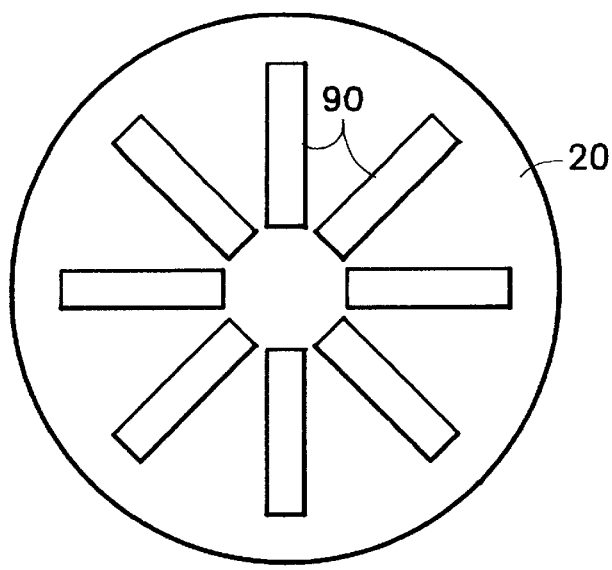
FIG. 4A is top view of a plasma reactor of a third embodiment of the invention employing plural radial magnet bars near the reactor ceiling.
Figure 4B:
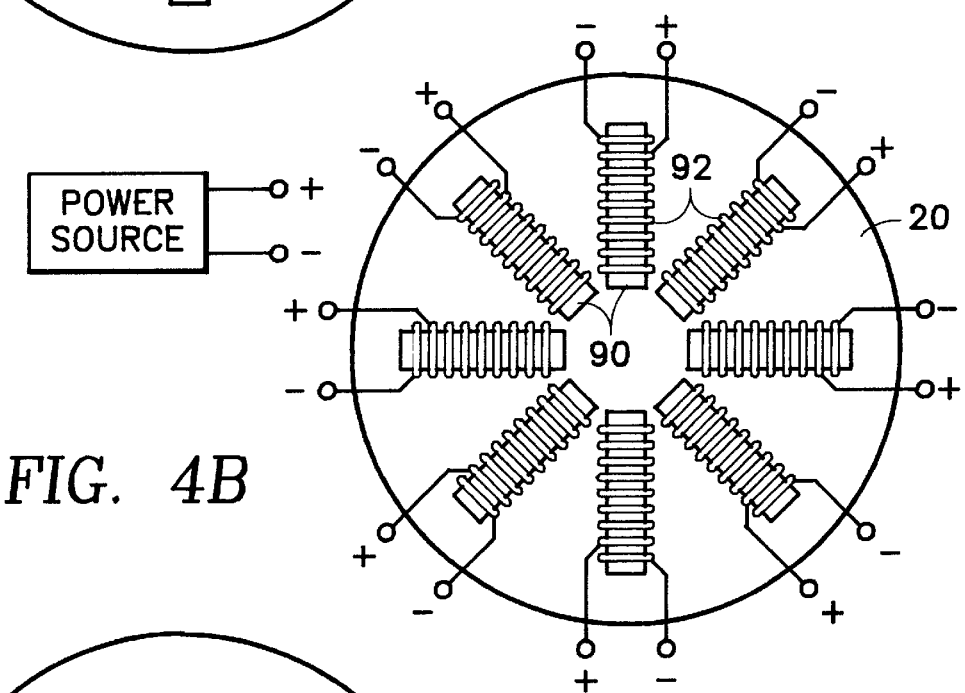
FIG. 4B is a top view of an embodiment similar to that of FIG. 4A but employing electromagnets in lieu of permanent magnets.

FIGS. 4A and 4B illustrate another embodiment of the invention providing the advantages enjoyed by the embodiments of FIGS. 1A, 1B, 2A, 2B 3A and 3B. In the embodiment of FIGS. 4A and 4B, a radially symmetrical MERIE magnetic field is provided by plural spoke magnets 90 each lying along respective radii of the circular ceiling 20. The spoke magnets 90 may be permanent magnets or electromagnets. If the spoke magnets are electromagnets, then they comprise conductive coils 92 each wound around a respective radial axis of symmetry, as shown in FIG. 4B. The two ends of each coil 92 are connected across the current source 66. The current source 66 may be a D.C. current source, an A.C. current source or and RF current source.

Figure 5:
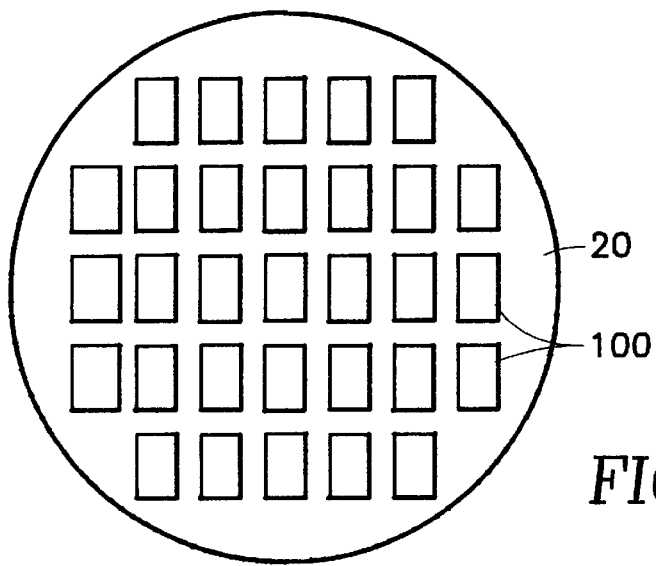
FIG. 5 is a top view of an embodiment of the invention employing a radially symmetrical matrix array of individual magnets over the reactor chamber ceiling.

In general, any radially symmetrical matrix or array of permanent magnets or electromagnets may be placed over the ceiling 20 in accordance with the present invention. For example, as illustrated in FIG. 5 a radially symmetrical array of magnets 100 covers the ceiling 20.

That the present invention provides dramatically improved etch rates was proven in an experiment in which the embodiment of FIGS. 2A and 2B was implemented using a permanent magnet in lieu of the electromagnet 60 and an otherwise conventional plasma reactor chamber. Without the permanent magnet, the etch rate of silicon dioxide on an 8-inch wafer was 4500 angstroms per minute. Then, when the permanent magnet was placed over the reactor chamber ceiling, the etch rate was 8000 angstroms per minute for the same processing parameters (RF power level and frequency, chamber pressure, processing gas flow rate and temperature).

While the invention has been described in detail by specific reference to preferred embodiments, it is understood that variations and modifications thereof may be made without departing from the true spirit and scope of the invention.

What is claimed is:

1. A plasma reactor for processing a workpiece, comprising:
    a reactor chamber including a ceiling;
    a pedestal for supporting said workpiece within said chamber under said ceiling;
    a processing gas supply inlet into said chamber;
    an RF plasma power source coupled to said pedestal; and
    a magnetic field source near said ceiling providing a radially symmetrical magnetic field relative to an axis of symmetry of said chamber within a portion of said chamber near said ceiling.

2. The reactor of claim 1 wherein said magnetic field source comprises plural magnets disposed over said ceiling in a radially symmetrical fashion with respect to said axis of symmetry.

3. The reactor of claim 2 wherein said plural comprises one of: (a) permanent magnets, (b) electromagnets.

4. The reactor of claim 2 wherein said radially symmetrical magnetic field penetrates from said ceiling into said chamber to a shallow depth, and wherein the height of said ceiling above said workpiece exceeds said depth.

5. The reactor of claim 2 wherein said plural magnets comprise plural ring magnets over said ceiling and centered at said axis of symmetry.

6. The reactor of claim 5 wherein said magnetic source further comprises a bar magnet disposed over said ceiling and on said axis of symmetry and having a magnetic field which contributes constructively to the field produced by said plural ring magnets.

7. The reactor of claim 6 wherein said ring magnets and said bar magnet are permanent magnets.

8. The reactor of claim 2 wherein said plural magnets comprise plural spoke magnets aligned with respective radii centered at said axis of symmetry.

9. The reactor of claim 8 wherein said plural spoke magnets are permanent magnets.

10. The reactor of claim 8 wherein said plural spoke magnets are electromagnets.

11. The reactor of claim 1 wherein said magnetic field source comprises an electromagnet.

12. The reactor of claim 11 wherein said electromagnet comprises plural windings formed of a single conductor path and disposed in radially symmetrical fashion with respect to said axis of symmetry of said pedestal, said conductor path having two ends for receiving an electrical current.

13. The reactor of claim 12 wherein said plural windings of said electromagnet are confined within a torus having a center hole.

14. The reactor of claim 13 wherein said magnetic source further comprises a center magnet over said ceiling and lying within said center hole of said torus of said electromagnet, said center magnet having a magnetic field which contributes constructively to the magnetic field of said electromagnet.

15. The reactor of claim 14 wherein said center magnet comprises a coil inductor comprising a winding wound in the same rotational direction as said winding of said electromagnetic.

16. The reactor of claim 12 wherein said electrical current is one of: (a) a D.C. current, (b) an A.C. current and (c) an RF current.

17. The reactor of claim 1 wherein said ceiling comprises a ceiling electrode, said RF power source being connected across said pedestal and said ceiling electrode.

18. The reactor of claim 17 further comprising a circuit for apportioning power from said RF power source between said pedestal and said ceiling electrode.

19. The reactor of claim 18 wherein said circuit comprises a coil inductor connected across said RF power source and a movable ground tap connecting a selected winding of said coil inductor to ground.

20. The reactor of claim 2 wherein said ceiling has plural corrugations therein forming plural internal channels and external channels and wherein said plural magnets are disposed in said plural external channels, at least a portion of said processing gas being in said internal channels.

21. The reactor of claim 20 wherein said plural magnets each have a pair of opposite magnetic poles and wherein opposite poles of magnets adjacent a common internal channel face one another across said internal channel whereby to form generally straight magnetic field lines across said internal channels.

22. The reactor of claim 5 wherein said ceiling has plural annular corrugations therein forming plural internal annular channels and external annular channels and wherein said plural ring magnets are disposed in said plural external annular channels, at least a portion of said processing gas being in said internal annular channels.

23. The reactor of claim 22 wherein said plural ring magnets each have a pair of opposite magnetic poles on opposite circumferential surfaces thereof and wherein opposite poles of ring magnets adjacent a common internal channel face one another across said internal channel whereby to form generally straight magnetic field lines across said internal channels.

24. The reactor of claim 1 wherein said radially symmetrical magnetic field has a field strength varying with the radial position in said chamber.

25. The reactor of claim 5 wherein said ring magnets have differing field strengths in accordance with a predetermined progression of field strengths.

26. The reactor of claim 25 wherein said field strengths of said plural ring magnets are a function of radial position.

27. The reactor of claim 13 wherein the density of said windings is a function of their radial position within said torus.

28. The reactor of claim 27 wherein said function increases with radius whereby to provide a greater density of windings near the outer circumference of said torus.

29. The reactor of claim 5 further comprising a magnetic yoke connected to one magnetic pole of a radially innermost one of said plural magnets and an opposite magnetic pole of a radially outermost one of said plural magnets.

30. A plasma reactor for processing a workpiece having an axis of symmetry, said reactor comprising:
a reactor chamber including a ceiling;
a pedestal for supporting said workpiece within said chamber under said ceiling;
a processing gas supply inlet into said chamber;
an RF plasma power source coupled to said pedestal; and
a magnetic field source near said ceiling providing a radially symmetrical magnetic field relative to said axis of symmetry within a portion of said chamber near said ceiling.

31. The reactor of claim 30 wherein said workpiece is disk-shaped and has an axis of symmetry extending vertically therethrough.

32. The reactor of claim 30 wherein said magnetic field source comprises plural magnets disposed over said ceiling in a radially symmetrical fashion with respect to said axis of symmetry.

33. The reactor of claim 32 wherein said plural comprises one of: (a) permanent magnets, (b) electromagnets.

34. The reactor of claim 32 wherein said radially symmetrical magnetic field penetrates from said ceiling into said chamber to a shallow depth, and wherein the height of said ceiling above said workpiece exceeds said depth.

* * * * *